(12) United States Patent
Wischnewskiy et al.

(10) Patent No.: US 10,236,797 B2
(45) Date of Patent: Mar. 19, 2019

(54) ULTRASONIC MOTOR

(71) Applicant: PHYSIK INSTRUMENTE (PI) GMBH & CO. KG, Karlsruhe (DE)

(72) Inventors: Wladimir Wischnewskiy, Rathenow (DE); Alexej Wischnewski, Wörth (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 277 days.

(21) Appl. No.: 15/104,349

(22) PCT Filed: Dec. 4, 2014

(86) PCT No.: PCT/DE2014/200676
§ 371 (c)(1),
(2) Date: Jun. 14, 2016

(87) PCT Pub. No.: WO2015/090312
PCT Pub. Date: Jun. 25, 2015

(65) Prior Publication Data
US 2016/0336877 A1    Nov. 17, 2016

(30) Foreign Application Priority Data

Dec. 18, 2013 (DE) ........................ 10 2013 226 418

(51) Int. Cl.
*H02N 2/02* (2006.01)
*H02N 2/00* (2006.01)
(Continued)

(52) U.S. Cl.
CPC ....... *H02N 2/0095* (2013.01); *H01L 41/0835* (2013.01); *H01L 41/0986* (2013.01); *H02N 2/002* (2013.01); *H02N 2/028* (2013.01)

(58) Field of Classification Search
CPC . H01L 41/0835; H01L 41/0986; H02N 2/002; H02N 2/0095; H02N 2/028
(Continued)

(56) References Cited

U.S. PATENT DOCUMENTS

| 6,765,335 B2 | 7/2004 | Wischnewskiy ......... 310/323.02 |
| 7,218,031 B2 | 5/2007 | Vyshnevskyy et al. ..................... 310/323.02 |

(Continued)

FOREIGN PATENT DOCUMENTS

| EP | 0 424 139 | 4/1991 | ............. H01L 41/09 |
| EP | 2 258 004 | 12/2010 | ............. H01L 41/09 |

(Continued)

OTHER PUBLICATIONS

The Notification Concerning Transmittal of International Preliminary Report on Patentability (Chapter I of the Patent Cooperation Treaty), in English, dated Jun. 30, 2016, the English translation of the International Preliminary Report on Patentability (Chapter I of the Patent Cooperation Treaty), dated Jun. 21, 2016, the English translation of the Written Opinion of the International Searching Authority (dated Jun. 21, 2016—mailed with the English translation of the International Preliminary Report on Patentability), and the International Search Report, in English, dated May 6, 2015, which were issued by the International Bureau of WIPO in Applicant's corresponding international PCT application having Serial No. PCT/DE2014/200676, filed on Dec. 4, 2014.

*Primary Examiner* — Derek Rosenau (74) *Attorney, Agent, or Firm* — Bodner & O'Rourke, LLP; Gerald T. Bodner; Christian P. Bodner (57) ABSTRACT

The invention relates to an ultrasonic motor, comprising a piezoelectric ultrasonic actuator (1) having four friction elements (4) disposed thereon, a friction surface (6) which is in frictional contact with the friction elements, and an electrical excitation device (16), wherein the ultrasonic actuator is in the shape of a ring or hollow cylinder, having an inner circumferential surface (14), an outer circumferential surface (12) and two planar end surfaces (5) connecting the inner and the outer circumferential surfaces. The four friction elements are disposed on one of the end surfaces of the ultrasonic actuator so as to be spaced equidistantly with respect to the circumferential direction, such that in each case two of the friction elements lie diametrically opposite, (Continued)

and the ultrasonic actuator comprises twelve identical circumferential sections (10), each of which has a generator for an acoustic standing wave to be formed in the ultrasonic actuator and the deformations of the ultrasonic actuator caused by the standing wave lead to deflections of the friction elements on a movement path inclined with respect to the end surface and/or a movement path substantially perpendicular to the end surface. Each generator has at least one excitation electrode (11), at least one general electrode (13) or a section of a general electrode and a layer of piezoceramic (15) disposed between the excitation electrode and the general electrode or the section of the general electrode.

5 Claims, 7 Drawing Sheets

(51) Int. Cl.
*H01L 41/083* (2006.01)
*H01L 41/09* (2006.01)

(58) Field of Classification Search
USPC .......................................... 310/323.01–323.21
See application file for complete search history.

(56) References Cited

U.S. PATENT DOCUMENTS

| | | | |
|---|---|---|---|
| 7,635,940 B2 | 12/2009 | Ue et al. | 310/317 |
| 8,928,205 B2 | 1/2015 | Koc | 310/323.02 |
| 2006/0145572 A1* | 7/2006 | Vyshnevskyy | H02N 2/103 |
| | | | 310/369 |

FOREIGN PATENT DOCUMENTS

| | | | |
|---|---|---|---|
| WO | WO 2004/064170 | 7/2004 | H01L 41/09 |
| WO | WO 2009/106412 | 9/2009 | H01L 41/09 |
| WO | WO 2011/044883 | 4/2011 | H01L 14/047 |

* cited by examiner

ULTRASONIC MOTOR

The invention relates to an ultrasonic motor according to the claims 1 to 5.

An ultrasonic motor is known from U.S. Pat. No. 6,765,335 B2, with which a linear single coordinate movement of the elements to be driven can be realised by means of an ultrasonic actuator. For the purpose of realising a two- or three-coordinate movement, respective ultrasonic motors require two or three mutually independent ultrasonic actuators (see EP 2 258 004 B1 or U.S. Pat. No. 7,635,940 B2 for example).

It is the object of the invention to provide an ultrasonic motor which is capable by means of only one single ultrasonic actuator to produce two- or three-coordinate movement of the element to be driven by said actuator.

This object is achieved by an ultrasonic motor according to claim 1, wherein the subsequent dependent claims at least comprise appropriate embodiments and further developments.

Accordingly, the invention is based on an ultrasonic motor, comprising a piezoelectric ultrasonic actuator in form of a ring or a hollow cylinder having an inner circumferential surface, an outer circumferential surface and two planar end surfaces connecting the inner and the outer circumferential surfaces to each other, wherein four friction elements are arranged on one of the planar end surfaces. The friction elements are disposed in a distributed manner over the circumference of the ultrasonic actuator or the end surface in equal distances from each other (i.e. equidistantly). In other words, a circumferential angle of 90° lies between two adjacent friction elements, so that two each of the four friction elements are disposed diametrically opposite of each other (i.e. with a circumferential angle distance of 180°). The friction elements are in frictional or operative contact with a friction surface of an element, e.g. a friction table, against which they are elastically pressed.

Furthermore, the ultrasonic motor in accordance with the invention comprises an electrical excitation apparatus. It is provided for the electrical connection with excitation electrodes and general electrodes, or with a general electrode of the ultrasonic actuator, wherein the excitation electrodes, together with the general electrodes or with the general electrode and a layer of piezoelectric material arranged between the excitation electrode and the general electrode, form a generator for an acoustic standing wave to be formed in the ultrasonic actuator. In summary, the ultrasonic actuator comprises twelve identical generators distributed over the circumference of the ultrasonic actuator. Each generator is part of an ultrasonic section of the hollow cylinder or ring, wherein each circumferential section forms a partial hollow cylinder.

As a result of respective electrical excitation of the generators via the electrical excitation apparatus, an acoustic standing or deformation wave is formed in the ultrasonic actuator which represents a wave resonator, and the deformations of the ultrasonic actuator caused by the standing wave lead to respective deflections of the friction elements on or along a movement path inclined in relation to the end surface and/or a direction substantially perpendicular to the end surface (transverse movement path), wherein the inclined movement path comprises a longitudinal or tangential component and a transverse or axial component, and the longitudinal or tangential component extends substantially parallel to the friction surface. A movement perpendicularly to the friction surface (Z-direction) can thus be generated by the deflection of the friction elements in the direction substantially perpendicularly to the end surface (i.e. on the transverse movement path), whereas a movement along the friction surface (X-Y plane) can be generated as a result of the deflection of the friction elements on or along the movement path inclined in relation to the end surface.

The ultrasonic motor in accordance with the invention can thus produce with only one ultrasonic actuator both a two-coordinate movement in one plane (the X-Y plane), and also a three-coordinate movement in which a movement is additionally made perpendicularly to the X-Y plane and thus in the Z-direction. A movement of the ultrasonic actuator relative to the friction surface is thus possible on the one hand. On the other hand, it can also be considered that the ultrasonic actuator is fixed and produces a relative movement of the element which forms the friction surface.

It may be advantageous that the excitation electrodes are arranged on the outer circumference of the ultrasonic actuator and the general electrode or the general electrodes are arranged on the inner circumferential surface of the ultrasonic actuator.

It can also be advantageous that the excitation electrodes, the general electrodes and the layers of piezo-ceramics which are respectively arranged therebetween are arranged substantially parallel to the end surfaces of the ultrasonic actuator.

It can further be advantageous that the electrical excitation apparatus provides an electrical alternating voltage with a frequency in which the sixth mode of the acoustic standing wave is generated in the ultrasonic actuator.

It can thus be advantageous that the ultrasonic motor contains a changeover switch for the electrodes, which connects said electrodes to the electrical excitation apparatus in such a way that upon generating the sixth mode of the acoustic standing wave in the ultrasonic actuator, the maximum deflection occurs on or along the inclined movement path in a pair of the friction elements disposed diametrically opposite of each other, and the minimum deflection on or along the inclined movement path occurs in the other pair of the of the friction elements disposed diametrically opposite of each other.

Figure 1:
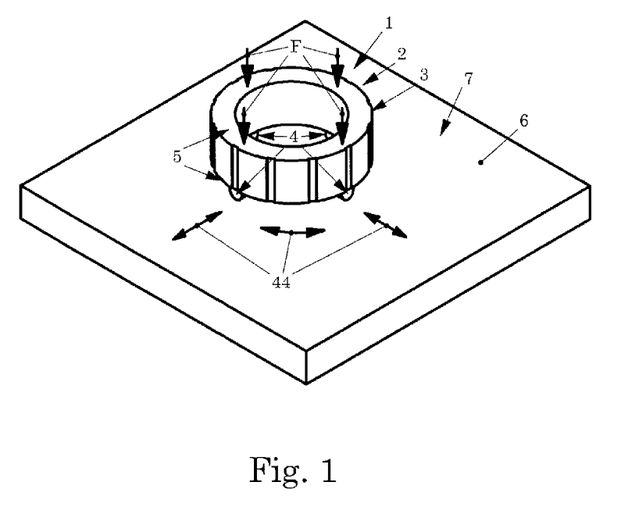
FIG. 1: an ultrasonic motor in accordance with the invention (without illustration of the electric excitation apparatus)

FIG. 1 shows an ultrasonic motor in accordance with the invention, comprising an ultrasonic actuator 1 which forms a wave resonator 2, wherein the ultrasonic actuator is formed as a hollow cylinder 3 made of a piezoelectric material, and on the planar end surface 5 of which four friction elements 4 are arranged. The ultrasonic actuator 1 is pressed by a force F with its frictional elements 4 in an elastic manner against the friction surface 6 of a friction table 7. The force F can be caused by gravity of the ultrasonic actuator, but it can also be caused by an additional element such as a spring or a magnet.

Figure 2:
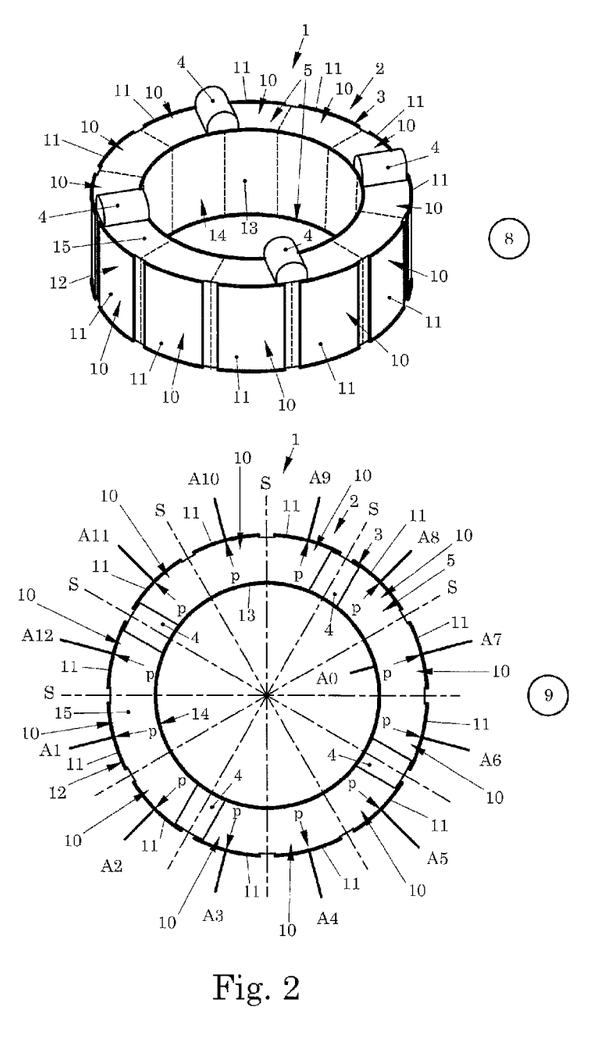
FIG. 2: illustration 8: ultrasonic actuator of the ultrasonic motor according to FIG. 1 in a perspective view; illustration 9: ultrasonic actuator of the ultrasonic motor according to FIG. 1 in a top view (viewing direction from above)

Illustration 8 of FIG. 2 shows the ultrasonic actuator according to FIG. 1 as a single part. The ultrasonic actuator comprises a total of twelve identical circumferential sections or circumferential segments 10. Each circumferential segment 10 comprises an excitation electrode 11, wherein the excitation electrodes of adjoining circumferential sections 10 do not touch each other. A completely circumferential general electrode 13 is arranged on the inner circumferential surface 14 of the ultrasonic actuator. Each excitation electrode 11, together with the respectively opposite section of the general electrode 13 and the layer of piezoelectric material arranged between the two electrodes, forms a generator for an acoustic standing or deformation wave to be formed in the ultrasonic actuator. Four friction elements 4 are arranged on the planar end surface 5, wherein the friction elements are each arranged in the region of the centre between two adjacent excitation electrodes. In other words, the line of symmetry of each friction element extends in the middle between two adjacent excitation electrodes. Two adjacent friction elements 4 enclose a circumferential angle of substantially 90°, so that there are two pairs of friction elements in which the two respective friction elements are arranged diametrically opposite of each other.

The geometric relationships between the individual elements of the ultrasonic actuator are shown in special detail in the illustration 9 of FIG. 2, which shows the ultrasonic actuator according to illustration 8 in a top view. Numerous diametric planes S (dot-dash lines) can be placed through the cylinder or the circle of the cylinder, which planes either each extend through the centre between two adjacent excitation electrodes, or which represent the planes of symmetry of the friction elements. The diametric planes S divide the hollow cylinder into twelve equal circumferential sections 10. In the illustration 8 of FIG. 2 and in the respective other drawings, the points of intersection of the diametric planes S with the ultrasonic actuator 1 are designated by dotted lines.

The direction of polarisation of the piezo-ceramic layer 15 is designated by respective arrows with the index p in the illustration 9 of FIG. 2. The direction of polarisation is oriented normally to the electrodes, so that a radially oriented polarisation is obtained. Furthermore, the illustration 9 of the FIG. 2 shows the electrical connections A1 to A12 of the excitation electrodes and the electrical connection A0 of the general electrode.

Figure 3:
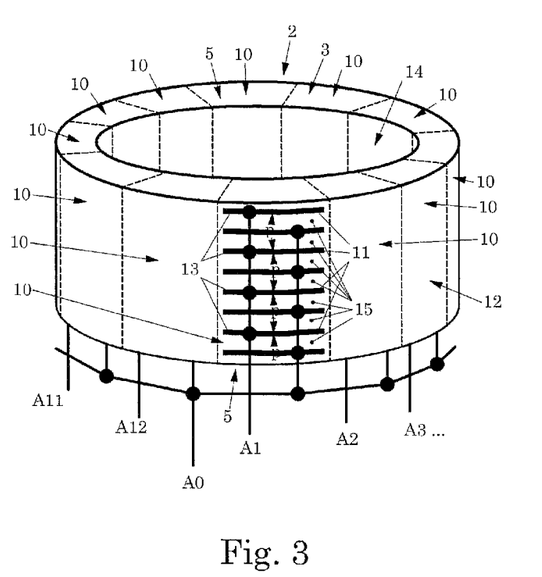
FIG. 3: embodiment of an ultrasonic actuator of an ultrasonic motor in accordance with the invention (without illustration of the friction elements)

FIG. 3 shows an alternative embodiment for an ultrasonic actuator of an ultrasonic motor in accordance with the invention. In this embodiment, several layers of excitation electrodes 11 and general electrodes 13 are present in alternating arrangement for each generator, wherein layers of piezo-ceramic material 15 are arranged between the electrode layers (so-called multilayer arrangement). The layers are stacked in this case in the axial direction of the ultrasonic actuator, and the direction of polarisation of the piezo-ceramic material is normal to the electrodes or normal to the end surfaces, i.e. in the axial direction, wherein the directions of polarisation of respectively adjacent layers of piezoelectric material are opposite (antiparallel direction of polarisation). All excitation electrodes 11 of the respective generator are contacted by the respective connection A1 to A12, while general electrodes 13 of the respective generator are contacted via the connection A0.

Figure 4:
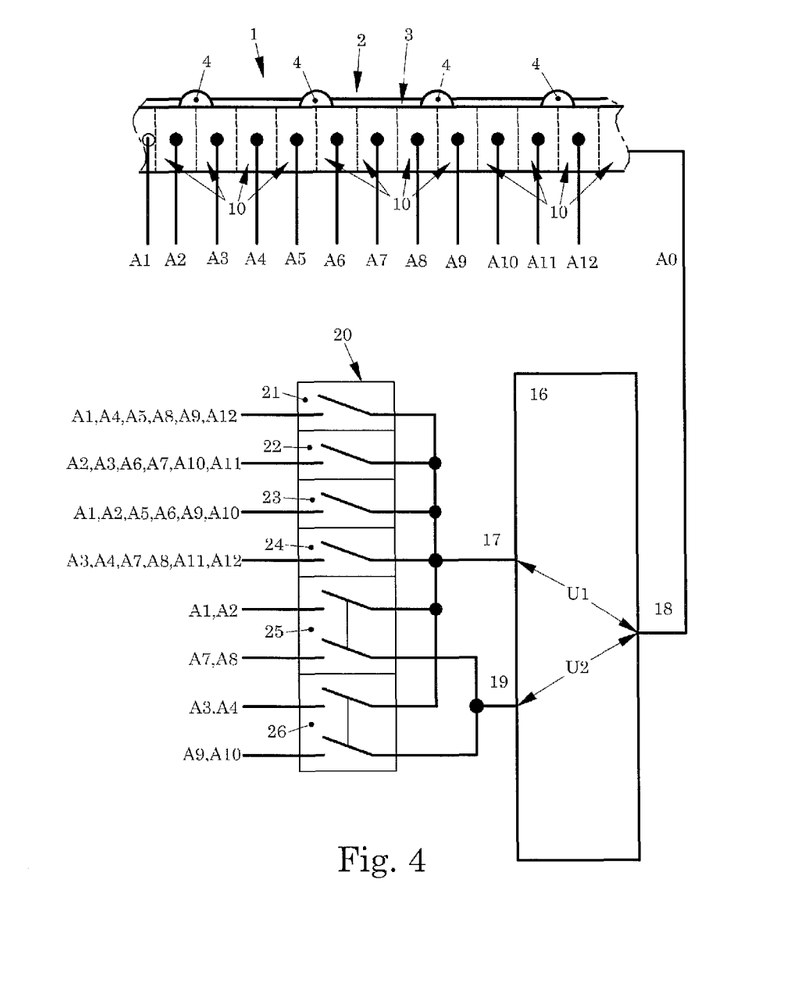
FIG. 4: block diagram concerning the connection of the ultrasonic actuator of an ultrasonic motor in accordance with the invention with the electrical excitation apparatus.

FIG. 4 shows a block diagram concerning the connection of the ultrasonic actuator of an ultrasonic motor in accordance with the invention with the electrical excitation apparatus 16. The respective electrical circuit comprises a changeover switch 20 having the off-switches 21 to 26, by means of which a connection between the electrical excitation apparatus and the excitation electrodes be triggered can be realised. The off-switch 21 is connected to the connections A1, A4, A5, A8, A9 and A12, and the off-switch 22 is connected to the connections A2, A3, A6, A7, A10 and A11, etc.

The electrical excitation apparatus 16 provides the electrical alternating voltage U1 at its connections 17 and 18, and the electrical alternating voltage U2 at the connections 19 and 18. These voltages are phase-shifted in relation to each other by the angle 180°. They have the same frequency fo, as a result of which the sixth mode of the acoustic deformation standing wave (six half-waves with $\lambda/2$) is excited or generated in the ultrasonic actuator 1. Each of the generators generates a $\lambda/4$ component of the standing wave.

Figure 5:
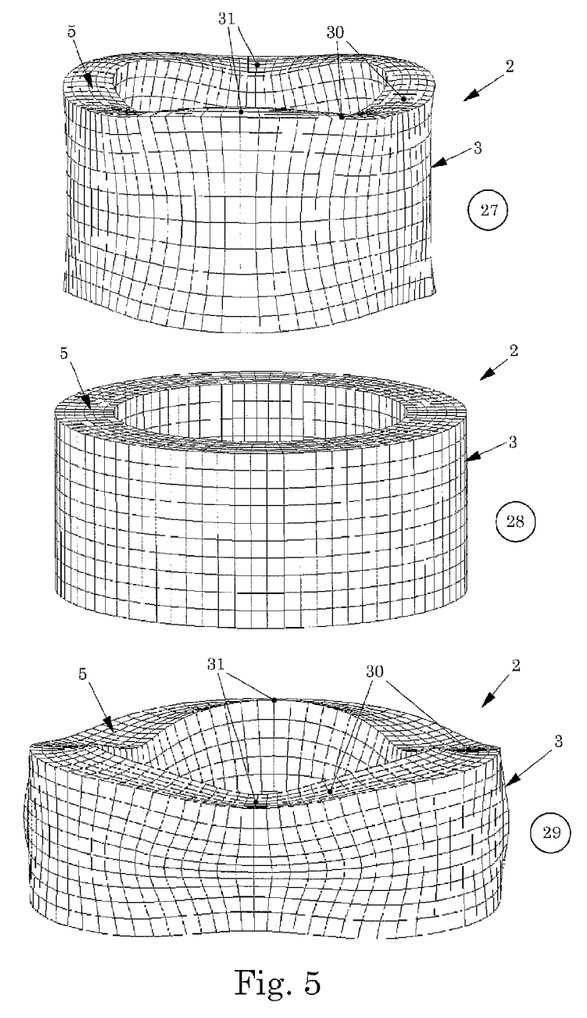
FIG. 5: illustration 28: FEM model of an ultrasonic actuator of an ultrasonic motor in accordance with the invention in the non-excited state; illustrations 27 and 29: FEM calculations of the phases of maximum deformation on the basis of the model according to illustration 28.

FIG. 5 shows in the illustration 28 the FEM model of an ultrasonic actuator of an ultrasonic motor in accordance with the invention in the non-excited state, while the illustrations 27 and 29 show FEM calculations on the base of the model according to the illustration 28 of the phases of maximum deformation on the basis of the standing wave excited in the ultrasonic actuator. Said standing wave is generated by the actuation of any of the off-switches 21 to 26. The points 30 of the end surface 5 disposed on the apexes of the standing wave only comprise a transverse or axial component of the oscillations. The points 31 of the end surface 5 on the other hand, which are situated on the descending sections of the standing wave, comprise both a transverse or axial component and also a longitudinal or tangential component of the oscillations.

The actuation of a random off-switch 21 to 26 does not lead to any change in the shape of the generated standing wave. Only the position of the wave changes in relation to the friction elements 4. The displacement of the wave is either half the wavelength, i.e. $\lambda/2$, or a quarter of the wavelength, i.e. $\lambda/4$.

Figure 6:
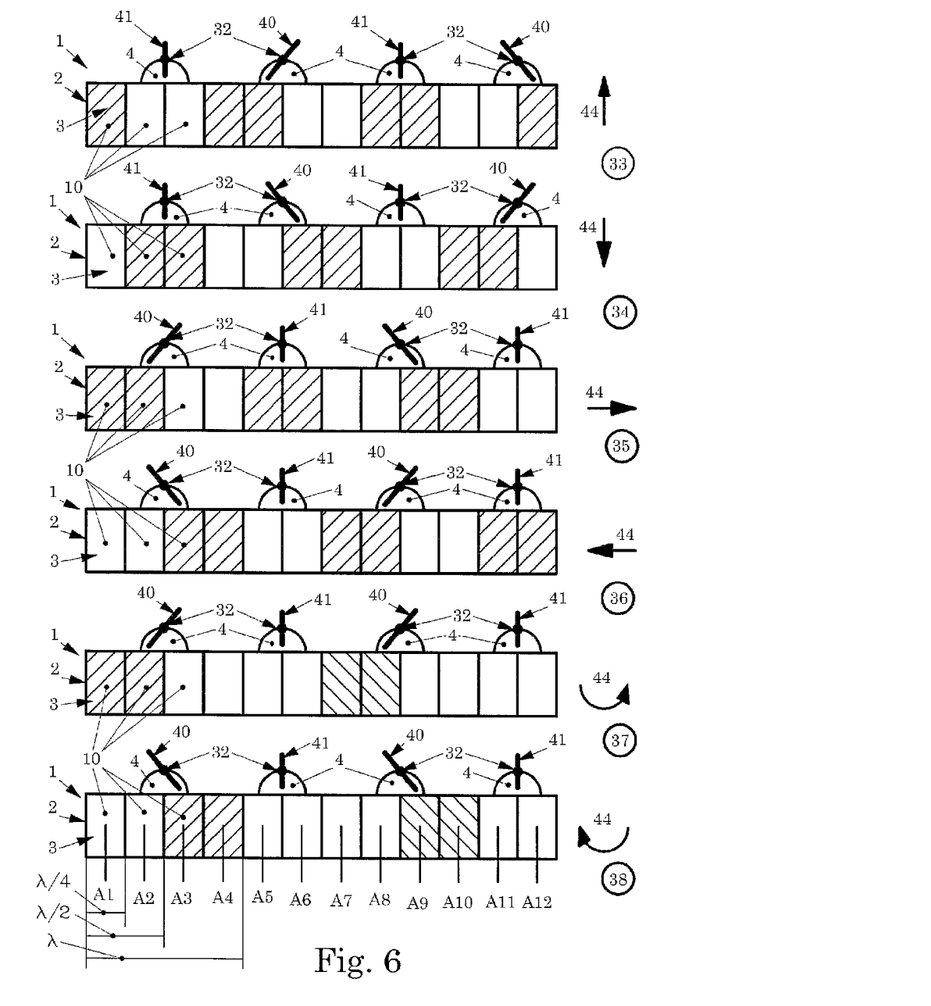
FIG. 6: illustrations 33 to 38: influence of the different electrical triggering of an ultrasonic actuator of an ultrasonic motor in accordance with the invention on the direction of deflection of the friction elements.

The previously described change in the wave position leads to a change in the movement path of the points 32 of the friction elements 4, as is shown in the illustrations 33 to 38 of FIG. 6.

Illustration 33 corresponds to the position of the off-switch 21 when activated. Illustration 34 corresponds to the position of off-switch 22 when activated. Illustration 35 corresponds to the position of the off-switch 23 when activated. Illustration 36 corresponds to the position of the off-switch 24 when activated. Illustration 37 corresponds to the position of the off-switch 25 when activated. Illustration 38 corresponds to the position of the off-switch 26 when activated.

In all cases, the points 32 move on two different movement paths, namely the inclined movement path 40 and the transverse movement path 41.

Figure 7:
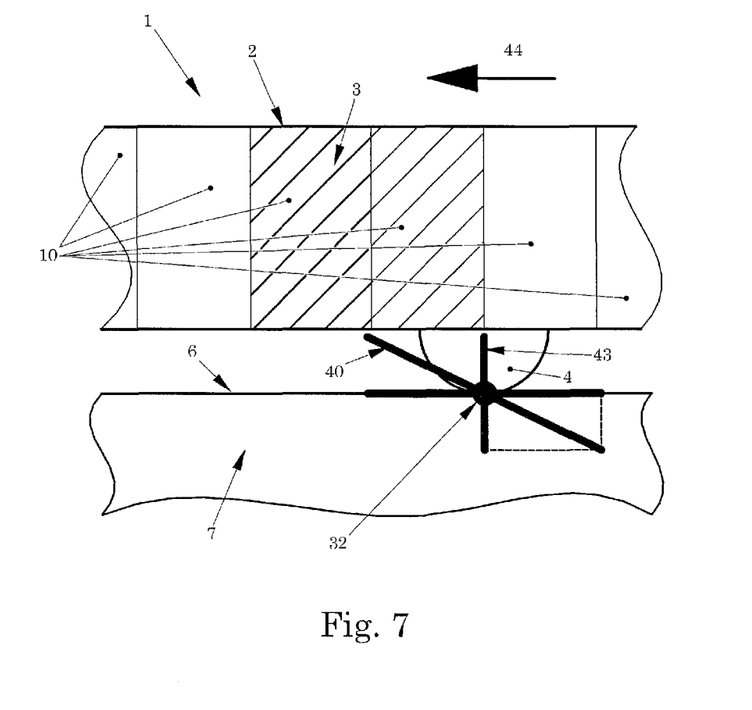
FIG. 7: contact and engagement situation between a friction element of an ultrasonic actuator of an ultrasonic motor in accordance with the invention and a friction surface.

FIG. 7 illustrates the movement of the points 32 of the friction elements 4 on the inclined movement path 40. The inclined movement path 40 can be broken down into two components, namely a longitudinal or tangential component 42 and a transverse or axial component 43. The longitudinal component 42 of the movement path ensures that the friction element 5 moves the actuator 1 in the direction shown with arrow 44 (driving direction).

The points 32 moving on the transverse moving path 41 do not have any longitudinal movement component, which is why they also have no influence on the movement of the actuator 1.

The actuation of the off-switches 21 to 26 leads to a change in the movement path of the point 32, namely from a transverse movement path 41 to an inclined movement path 40 and to the reversal of the angle of inclination of the movement path 40 shown in the illustrations 33 to 38 of FIG. 6. This reversal of the angle of inclination of the movement path 40 leads to a reversal in movement (also see the change in the movement of the actuator 1 on the friction table 7 illustrated in FIG. 1 by the six arrows 44).

The actuation of the off-switches 21 to 26 allows a linear movement of the actuator 1 on the friction surface 6, namely in the forward direction (according to the illustration 33 of FIG. 6), in the rearward direction (according to the illustration 34 of FIG. 6), to the right (according to the illustration 35 of FIG. 6), and to the left (according to the illustration 36 of FIG. 6). A clockwise rotational movement (according to the illustration 37 of FIG. 6) or a counterclockwise rotational movement (according to the illustration 38 of FIG. 6) is also possible.

The invention allows a constructive configuration of the ultrasonic motor in which the ultrasonic actuator is fastened, which provides movement to the friction table 7 arranged in the guides, wherein the guides limit the movement extending perpendicularly to the end surfaces 5 of the actuator 1 (not shown in the drawings).

The invention claimed is:

1. An ultrasonic motor, comprising a piezoelectric ultrasonic actuator (1) having four friction elements (4) disposed thereon, a friction surface (6) which is in frictional contact with the friction elements, and an electrical excitation apparatus (16), wherein the ultrasonic actuator is in the shape of a ring or hollow cylinder, having an inner circumferential surface (14), an outer circumferential surface (12) and two planar end surfaces (5) connecting the inner and the outer circumferential surfaces, wherein the four friction elements are disposed on one of the end surfaces of the ultrasonic actuator so as to be spaced equidistantly with respect to the circumferential direction, such that in each case two of the friction elements lie diametrically opposite, and the ultrasonic actuator comprises twelve identical circumferential sections (10), each of which has a generator for an acoustic standing wave to be formed in the ultrasonic actuator, and each generator has at least one excitation electrode (11), at least one general electrode (13) or a section of a general electrode and a layer of piezo-ceramic material (15) disposed between the excitation electrode and the general electrode or the section of the general electrode, characterized in that the generators are operable such that the deformations of the ultrasonic actuator caused by the standing wave lead to deflections of a pair of diametrically opposite friction elements on a movement path inclined with respect to the end surface and to deflections of the other pair of diametrically opposite friction elements on a movement path substantially perpendicular to the end surface.

2. An ultrasonic motor according to claim 1, characterized in that the excitation electrodes are arranged on the outer circumferential surface of the ultrasonic actuator, and the general electrode or the general electrodes are arranged on the inner circumferential surface of the ultrasonic actuator.

3. An ultrasonic motor according to claim 1, characterized in that the excitation electrodes, the general electrodes and the respective layers of piezo-ceramic material arranged therebetween are arranged substantially parallel to the end surfaces of the ultrasonic actuator.

4. An ultrasonic motor according to claim 1, characterized in that the electrical excitation apparatus provides an electrical alternating voltage with a frequency in which the sixth mode of the acoustic standing wave is generated in the ultrasonic actuator.

5. An ultrasonic motor according to claim 4, characterized in that it comprises a changeover switch (20) for the electrodes, which connects said electrodes to the electrical excitation apparatus in such a way that upon generating the sixth mode of the acoustic standing wave in the ultrasonic actuator the maximum deflection along the inclined part of movement occurs in a pair of the diametrically opposite friction elements, and the minimum deflection occurs along the inclined part of movement in the other pair of the diametrically opposite friction elements.

* * * * *